(12) United States Patent
Campbell et al.

(10) Patent No.: US 7,385,817 B2
(45) Date of Patent: Jun. 10, 2008

(54) COOLING APPARATUS AND METHOD EMPLOYING DISCRETE COLD PLATES DISPOSED BETWEEN A MODULE ENCLOSURE AND ELECTRONICS COMPONENTS TO BE COOLED

(75) Inventors: Levi A. Campbell, Poughkeepsie, NY (US); Richard C. Chu, Hopewell Junction, NY (US); Michael J. Ellsworth, Lagrangeville, NY (US); Madhusudan K. Iyengar, Woodstock, NY (US); Roger R. Schmidt, Pougkeepsie, NY (US); Robert E. Simons, Pouhkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/871,334

(22) Filed: Oct. 12, 2007

(65) Prior Publication Data

US 2008/0030953 A1    Feb. 7, 2008

Related U.S. Application Data

(63) Continuation of application No. 11/258,314, filed on Oct. 25, 2005, now Pat. No. 7,298,617.

(51) Int. Cl.
*H05K 7/20* (2006.01)
*F28F 7/00* (2006.01)
(52) U.S. Cl. .................... 361/699; 165/80.4; 361/702
(58) Field of Classification Search ............... 361/699, 361/702
See application file for complete search history.

(56) References Cited

U.S. PATENT DOCUMENTS

| 4,468,717 A | 8/1984 | Mathias et al. |
| 4,748,495 A | 5/1988 | Kucharek |
| 5,023,695 A | 6/1991 | Umezawa et al. |

(Continued)

OTHER PUBLICATIONS

Campbell et al, "Cooling System and Method Employing a Closed Loop Coolant Path and Micro-Scaled Cooling Structure with an Electronics Subsystem of an Electronics Rack," U.S. Appl. No. 11/008,771, filed Dec. 9, 2004.

(Continued)

*Primary Examiner*—Gregory D Thompson
(74) *Attorney, Agent, or Firm*—Lily Neff, Esq.; Kevin P. Radigan, Esq.; Heslin Rothenberg Farley & Mesiti, P.C.

(57) ABSTRACT

Cooling apparatuses and methods are provided for cooling an assembly including a substrate supporting multiple electronics components. The cooling apparatus includes: multiple discrete cold plates, each having a coolant inlet, a coolant outlet and at least one coolant chamber disposed therebetween; and multiple coolant-carrying tubes, each tube extending from a respective cold plate and being in fluid communication with the coolant inlet or outlet of the cold plate. An enclosure is provided having a perimeter region which engages the substrate to form a cavity with the electronics components and cold plates being disposed within the cavity. The enclosure is configured with multiple bores, each bore being sized and located to receive a respective coolant-carrying tube of the tubes extending from the cold plates. Further, the enclosure is configured with a manifold in fluid communication with the tubes for distributing coolant in parallel to the cold plates.

3 Claims, 6 Drawing Sheets

100

U.S. PATENT DOCUMENTS

| | | |
|---|---|---|
| 5,144,531 A | 9/1992 | Go et al. |
| 5,266,372 A | 11/1993 | Arakawa et al. |
| 5,294,830 A | 3/1994 | Young et al. |
| 5,309,319 A | 5/1994 | Messina |
| 5,349,498 A | 9/1994 | Tanzer et al. |
| 5,420,753 A | 5/1995 | Akamatsu et al. |
| 5,463,528 A | 10/1995 | Umezawa |
| 5,774,334 A | 6/1998 | Kawamura et al. |
| 6,330,157 B1 | 12/2001 | Bezama et al. |
| 6,351,384 B1 | 2/2002 | Daikoku et al. |
| 6,366,461 B1 | 4/2002 | Pautsch et al. |
| 6,587,343 B2 | 7/2003 | Novotny et al. |
| 6,754,076 B2 | 6/2004 | Cox et al. |
| 6,783,393 B2 * | 8/2004 | Bendelli et al. ............ 439/577 |
| 6,826,923 B2 | 12/2004 | Nakano et al. |
| 6,890,799 B2 * | 5/2005 | Daikoku et al. ............ 438/122 |
| 6,988,534 B2 | 1/2006 | Kenny et al. |
| 7,000,684 B2 | 2/2006 | Kenny et al. |
| 7,104,312 B2 | 9/2006 | Goodson et al. |
| 7,156,159 B2 | 1/2007 | Lovette et al. |
| 7,187,549 B2 | 3/2007 | Teneketges et al. |
| 7,201,217 B2 | 4/2007 | Johnson et al. |
| 7,233,494 B2 | 6/2007 | Campbell et al. |
| 7,298,618 B2 * | 11/2007 | Campbell et al. ........... 361/699 |
| 2004/0080912 A1 | 4/2004 | Goth et al. |

OTHER PUBLICATIONS

M.A. LoPresti, "Militarized Drawer for Conduction Cooled WME Modules," IBM Technical Disclosure Bulletin, vol. 37, No. 5, (pp. 109-110) (May 1994).

* cited by examiner

COOLING APPARATUS AND METHOD EMPLOYING DISCRETE COLD PLATES DISPOSED BETWEEN A MODULE ENCLOSURE AND ELECTRONICS COMPONENTS TO BE COOLED

CROSS-REFERENCE TO RELATED APPLICATIONS

This application is a continuation of co-pending U.S. patent application Ser. No. 11/258,314, filed Oct. 25, 2005, and published Apr. 26, 2007 as U.S. Patent publication No. US-2007-0091569 A1, entitled "Cooling Apparatus and Method Employing Discrete Cold Plates Disposed Between a Module Enclosure and Electronics Components to be Cooled", by Campbell et al., the entirety of which is hereby incorporated herein by reference. This application also contains subject matter which is related to the subject matter of the following applications, which are assigned to the same assignee as this application and which are hereby incorporated herein by reference in their entirety:

"Cooling System and Method Employing a Closed Loop Coolant Path and Micro-Scaled Cooling Structure within an Electronics Subsystem of an Electronics Rack", Campbell et al., Ser. No. 11/008,771, filed Dec. 9, 2004; and "Cooling Apparatuses and Methods Employing Discrete Cold Plates Compliantly Coupled Between a Common Manifold and Electronics Components of an Assembly to be Cooled," Campbell et al., Ser. No. 11/258,316, filed Oct. 25, 2005, and published Apr. 26, 2007, as a U.S. Patent Publication No. US-2007-0091570 A1.

TECHNICAL FIELD

The present invention relates to cooling apparatuses and methods for removing heat generated by electronics components (e.g., devices, modules, systems, etc.) and to methods of constructing such cooling apparatuses. More particularly, the present invention relates to cooling apparatuses and methods for extracting heat from heat generating electronics components of a multi-component electronics module.

BACKGROUND OF THE INVENTION

As is known, operating electronic devices produce heat. This heat should be removed from the devices in order to maintain device junction temperatures within desirable limits. Failure to remove the heat thus produced results in increased device temperatures, potentially leading to thermal runaway conditions. Several trends in the electronics industry have combined to increase the importance of thermal management, including heat removal for electronics devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. These trends have combined to create applications where it is no longer desirable to remove heat from modern devices solely by traditional air cooling methods, such as by using traditional air cooled heat sinks. These trends are likely to continue, furthering the need for alternatives to traditional air cooling methods.

One approach to avoiding the limitations of traditional air cooling is to use a cooling liquid. As is known, different liquids provide different cooling capabilities. In particular, liquids such as refrigerants or other dielectric fluids (e.g., fluorocarbon fluid) exhibit relatively poor thermal conductivity and specific heat properties, i.e., when compared to liquids such as water or other aqueous fluids. Dielectric liquids have an advantage, however, in that they may be placed in direct physical contact with electronic devices and interconnects without adverse affects such as corrosion or electrical short circuits. For example, U.S. Pat. No. 6,052,284, entitled "Printed Circuit Board with Electronic Devices Mounted Thereon", describes an apparatus in which a dielectric liquid flows over and around several operating electronic devices, thereby removing heat from the devices. Similar approaches are disclosed in U.S. Pat. No. 5,655,290, entitled "Method for Making a Three-Dimensional Multi-chip Module" and U.S. Pat. No. 4,888,663, entitled "Cooling System for Electronic Assembly".

Other cooling liquids, such as water or other aqueous liquids, exhibit superior thermal conductivity and specific heat compared to dielectric liquids. Water-based coolants, however, must be kept from physical contact with electronic devices and interconnects, since corrosion and electrical short circuit problems are likely to result from such contact. Various methods have been disclosed for using water-based coolants, while providing physical separation between the coolant and the electronic devices. For example, U.S. Pat. No. 4,531,146, entitled "Apparatus for Cooling High-Density Integrated Circuit Packages", discloses the use of a conductive foil barrier; U.S. Pat. No. 4,879,629, entitled "Liquid Cooled Multi-chip Integrated Circuit Module Incorporating A Seamless Compliant Member for Leakproof Operation", and IBM Technical Disclosure Bulletin Vol. 20, No. 2, July 1977, entitled "Liquid Cooled Module with Compliant Membrane", disclose the use of a flexible barrier with thermal conduction enhancements (thermal studs and heatsinks, respectively); and U.S. Pat. No. 4,381,032, entitled "Apparatus for Cooling High-Density Integrated Circuit Packages", and U.S. Pat. No. 5,294,830, entitled "Apparatus for Indirect Impingement Cooling of Integrated Circuit Chips", disclose the use of flexible barriers, where pistons are used to maintain contact between the barrier and the devices to be cooled.

Notwithstanding the above, there remains a large and significant need to provide further useful cooling apparatus enhancements for facilitating cooling of electronic modules, and particularly multi-chip modules.

SUMMARY OF THE INVENTION

The shortcomings of the prior art are overcome and additional advantages are provided through the provision of a cooling apparatus for facilitating cooling of an electronics assembly comprising a substrate supporting multiple heat generating electronics components. The cooling apparatus includes: multiple discrete cold plates and a plurality of coolant-carrying tubes. Each cold plate has a first surface configured to couple to a respective electronics component of the multiple electronics components, and each cold plate is a coolant-cooled cold plate having a coolant inlet and a coolant outlet with at least one coolant chamber disposed between the coolant inlet and the coolant outlet. Each cold plate has at least two coolant-carrying tubes extending from a second surface thereof. Each coolant-carrying tube is in fluid communication with either the coolant inlet or the coolant outlet of the associated cold plate from which it extends. The cooling apparatus further includes an enclosure having a perimeter region for engaging the substrate to form an at least partially enclosed cavity with the multiple heat generating electronics components and the multiple cold plates being disposed within the cavity defined by the substrate and the enclosure. The enclosure is configured with a plurality of bores, each bore being sized and located to at least partially receive a respective coolant-carrying tube extending from one of the cold plates. The enclosure is further configured with a manifold in fluid communication with the plurality of bores and the plurality of coolant-carrying tubes disposed therein for distributing coolant in parallel to at least some cold plates of the multiple cold plates via a first set of coolant-carrying tubes in fluid communication with the coolant inlets of the cold plates, and for receiving coolant from at least some cold plates of the multiple cold plates via a second set of coolant-carrying tubes in fluid communication with the coolant outlets of the cold plates.

In another aspect, a cooled electronics module is provided which includes an electronics assembly having a substrate supporting multiple heat generating electronics components to be cooled, and a cooling apparatus for facilitating cooling of the electronics components. The cooling apparatus includes: multiple discrete cold plates and a plurality of coolant-carrying tubes. Each cold plate has a first surface configured to couple to a respective electronics component of the multiple electronics components, and each cold plate is a coolant-cooled cold plate having a coolant inlet and a coolant outlet with at least one coolant chamber disposed between the coolant inlet and the coolant outlet. Each cold plate has at least two coolant-carrying tubes extending from a second surface thereof. Each coolant-carrying tube is in fluid communication with either the coolant inlet or the coolant outlet of the associated cold plate from which it extends. The cooling apparatus further includes an enclosure having a perimeter region engaging the substrate to form an at least partially enclosed cavity with the multiple heat generating electronics components and the multiple cold plates being disposed within the cavity defined by the substrate and the enclosure. The enclosure is configured with a plurality of bores, each bore being sized and located to at least partially receive a respective coolant-carrying tube extending from one of the cold plates. The enclosure is further configured with a manifold in fluid communication with the plurality of bores and the plurality of coolant-carrying tubes disposed therein for distributing coolant in parallel to at least some cold plates of the multiple cold plates via a first set of coolant-carrying tubes in fluid communication with the coolant inlets of the cold plates, and for receiving coolant from at least some cold plates of the multiple cold plates via a second set of coolant-carrying tubes in fluid communication with the coolant outlets of the cold plates.

In a further aspect, a method of fabricating a cooling apparatus is provided for facilitating cooling of an electronics assembly comprising a substrate supporting multiple heat generating electronics components to be cooled. The method includes: providing multiple discrete cold plates with a plurality of coolant-carrying tubes extending therefrom, each cold plate having a first surface configured to couple to a respective electronics component of the multiple electronics components, and each cold plate being a coolant-cooled cold plate configured with a coolant inlet and a coolant outlet with at least one coolant chamber disposed between the coolant inlet and the coolant outlet, each cold plate further having at least two coolant-carrying tubes of the plurality of coolant-carrying tubes extending from a second surface thereof, each coolant-carrying tube being in fluid communication with one of the coolant inlet and the coolant outlet of the cold plate from which the coolant-carrying tube extends; coupling each cold plate to a respective electronics component of the multiple electronics components; and providing an enclosure having a perimeter region, and engaging the perimeter region of the enclosure with a substrate to form an at least partially enclosed cavity with the multiple heat generating electronics components and the multiple cold plates being disposed within the cavity defined by the substrate and the enclosure, wherein the enclosure is configured with a plurality of bores, each bore being sized and located to at least partially receive a respective coolant-carrying tube of the plurality of coolant-carrying tubes extending from the cold plates as the enclosure engages the substrate, the enclosure further being configured with a manifold in fluid communication with the plurality of bores and the plurality of coolant-carrying tubes disposed therein for distributing coolant in parallel to at least some cold plates of the multiple cold plates via a first set of coolant-carrying tubes in fluid communication with the coolant inlets of the multiple cold plates, and for receiving coolant from at least some cold plates of the multiple cold plates via a second set of coolant-carrying tubes in fluid communication with the coolant outlets of the multiple cold plates.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "heat generating electronics component" may comprise any component of a computer system or other electronic system requiring cooling, and includes one or more integrated circuit devices, semiconductor chips, or other electronic circuitry requiring cooling. The "surface to be cooled" refers to a surface of the heat generating electronics component itself, or to an exposed surface of a thermal spreader, passivation layer, or other surface in thermal contact with the electronics component, and through which heat generated by the electronics component is to be extracted. A "micro-scaled cooling structure" means a cooling structure or cold plate with a characteristic dimension of 200 microns or less. A "biasing mechanism" refers to any biasing structure, such as one or more springs, leafs, etc., with a single spring arrangement per cold plate being illustrated in one embodiment provided herein by way of example only.

One example of coolant for a cooling apparatus in accordance with an aspect of the present invention is water. However, the concepts disclosed herein are readily adapted for use with other types of liquid coolant. For example, one or more of the coolants may comprise a brine, a fluorocarbon liquid, a liquid metal, or other similar coolant, or a refrigerant, while still maintaining the advantages and unique features of the present invention.

As noted briefly above, power levels in computer equipment (primarily processors) are rising to a level to where they no longer can simply be air cooled. These components will likely be water cooled. Heat dissipated by the processor can be transferred to water via a water cooled cold plate, certain embodiments of which are described in the above-incorporated, co-pending United States patent application entitled "Cooling System and Method Employing a Closed Loop Coolant Path and Micro-Scaled Cooling Structure within an Electronics Subsystem of an Electronics Rack". Further, power produced by leakage current within electronics components is now of the same order as the switching power for the components, and is a strong function of temperature; that is, the lower the temperature, the lower the leakage current/power.

Generally stated, provided herein is a very high thermal performance cooled electronics module, such as a multichip module. High performance micro-scaled cooling structures or cold plates are beginning to exist in the industry, but are geared for single-chip operation. Disclosed herein are various aspects by which these high performance cold plates are individually mounted or attached to multiple electronics components within an electronics module. Further, an enclosure with a common manifold is provided for distributing coolant in parallel to the individual cold plates. Methods of assembly and disassembly are also described, which facilitate an electronics component rework capability.

Figure 1A:
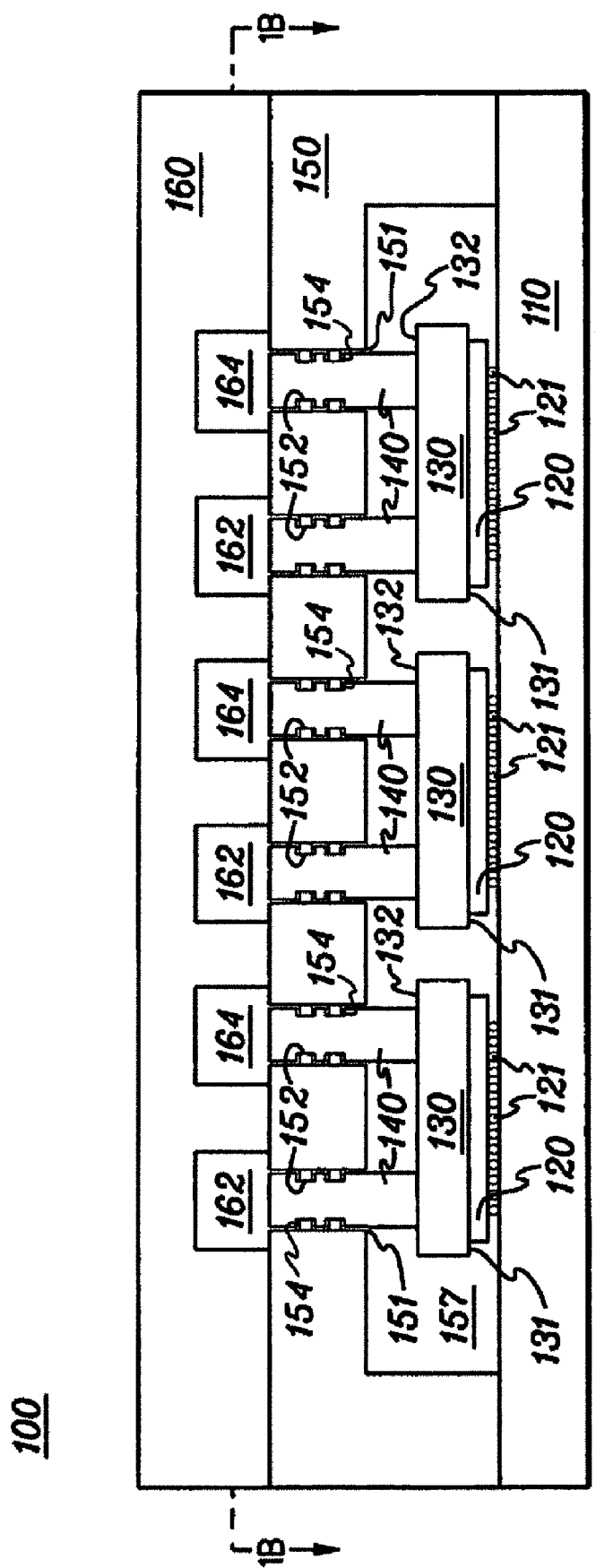
FIG. 1A is a cross-sectional elevational view of one embodiment of a cooled electronics module (taken along line 1A-1A of FIG. 1B), with a cooling apparatus in accordance with an aspect of the present invention.

Referring to the drawings, wherein the same reference numbers used through multiple figures designate the same or similar elements, FIG. 1A depicts one embodiment of a cooled electronics module, generally denoted 100, in accordance with an aspect of the present invention. This module includes a substrate 110, which may include conductive wiring (not shown) on an upper surface thereof and/or embedded therein. One or more electronics components 120 are electrically connected to the electrical wiring of substrate 110 via, for example, solder ball connections 121. Multiple discrete cold plates 130 each have a first surface 131 configured to couple to the surface to be cooled of a respective electronics component 120. Various techniques can be employed to couple each cold plate to its respective electronics component. For example, each discrete cold plate can be fabricated of copper and attached to its respective electronics component by a thermally conductive adhesive or via a suitable solder, such as an indium or an indium-based alloy solder. An example of a suitable thermally conductive adhesive is Ablebond 965-1L, manufactured by Ablestik Laboratories, Rancho Dominguez, Calif., while indium solder can be obtained from the Indium Corporation of America, Utica, N.Y. A soldered interface is advantageous in providing a lower thermal resistance, and facilitates reworking of electronics components. In alternate embodiments, one or more of the cold plates could comprise a composite metal structure, or a ceramic material if a thermally conductive adhesive is employed as the cold plate-to-electronics component interface.

Figure 2:
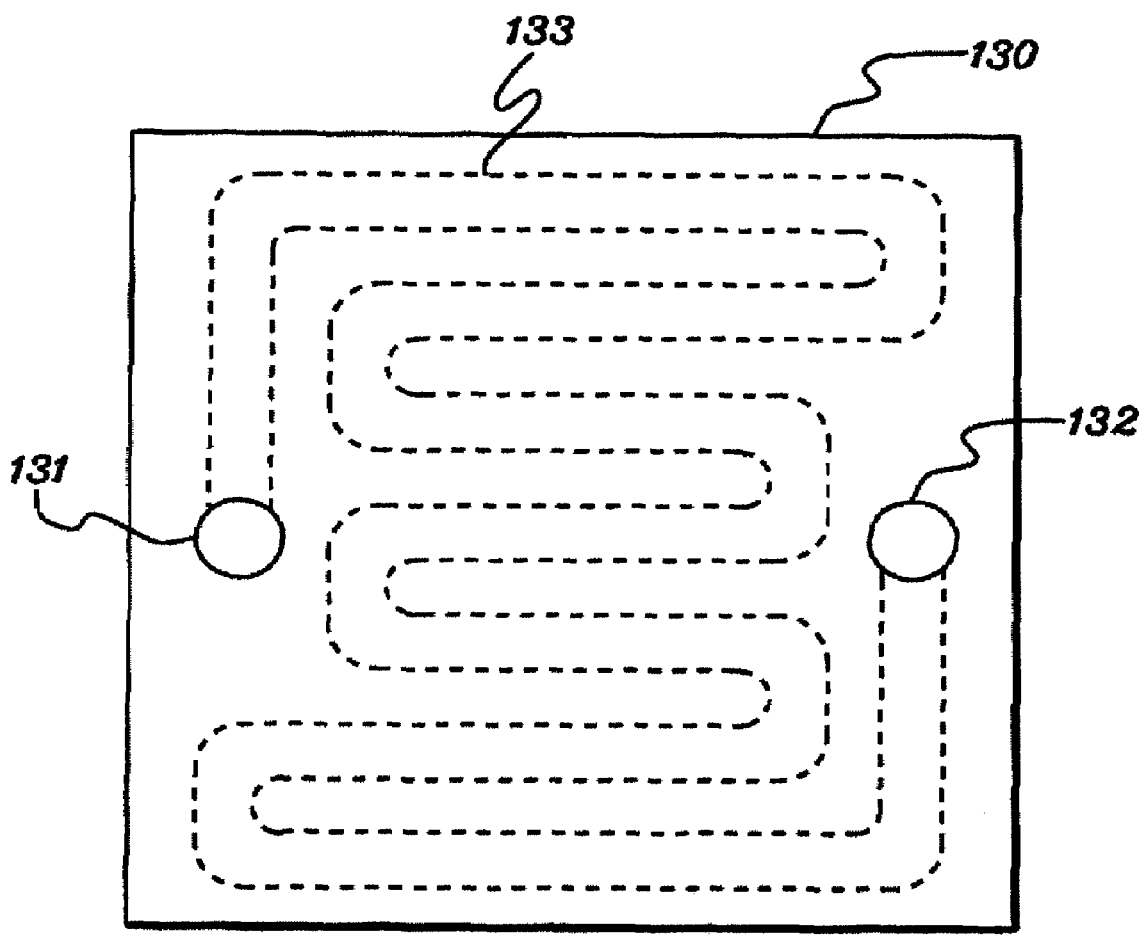
FIG. 2 is a top plan view of one embodiment of a cold plate employed in a cooling apparatus, in accordance with an aspect of the present invention.

FIG. 2 depicts one embodiment of a cold plate 130, useful in a cooling apparatus in accordance with the present invention. In this embodiment, cold plate 130 is a coolant-cooled cold plate configured with a coolant inlet 131 and a coolant outlet 132 with at least one coolant chamber 133 disposed between the coolant inlet and the coolant outlet. Various other cold plate embodiments may also be employed, including, for example, jet orifice cold plates and cold plates having multiple parallel channels between the coolant inlet and the coolant outlet. Further, as noted above, each cold plate may comprise a micro-scaled cooling structure, with a characteristic dimension of 200 microns or less.

Returning to FIG. 1A, a plurality of coolant-carrying tubes 140 extend from cold plates 130 and couple cold plates 130 in fluid communication with an inlet plenum 162 and an outlet plenum 164 of an enclosure comprising a cap 150 and a manifold 160. As shown, at least two coolant-carrying tubes 140 extend from a second surface 132 of each cold plate 130. The coolant-carrying tubes 140 are, in one embodiment, identical cylindrical tubes having a common geometric cross-section, e.g., circular, square, rectangular, etc. In the embodiment shown, tubes 140 project normal to second surface 132 of the associated cold plate 130, and may be formed integral with the associated cold plate or sealed thereto. Alternatively, coolant-carrying tubes 140 may be of two or more differing cross-sections, in either or both geometry and size. For example, both tubes extending from a cold plate may be cylindrical, but one tube may be larger in flow cross-sectional area, or one tube may be cylindrical and the other tube square, or elliptical in cross-section. As a further example, one tube may be cylindrical and smaller in cross-sectional area, while the other tube may be elliptical and larger in cross-sectional area.

Cap 150 is configured with a plurality of bores (or openings) 151, with each bore being sized and located to at least partially receive a respective coolant-carrying tube 140 extending from a cold plate 130 aligned beneath the bore. Each tube 140 is sealed to an inner wall of cap 150 defining the respective bore 151 by a sealant, which in this embodiment, comprises a double O-ring or equivalent elastomeric seal 152 disposed between the tube and the cap 150. To facilitate positioning of the O-rings, multiple circumferential grooves 154 are provided in the outer surface portion of each tube 140 disposed within the associated bore. Although shown as a double O-ring for reliability, the sealant could alternatively be a single O-ring if desired. The purpose of the sealant is to isolate the coolant from directly contacting the electronics components and their interconnect wiring.

Figure 1B:
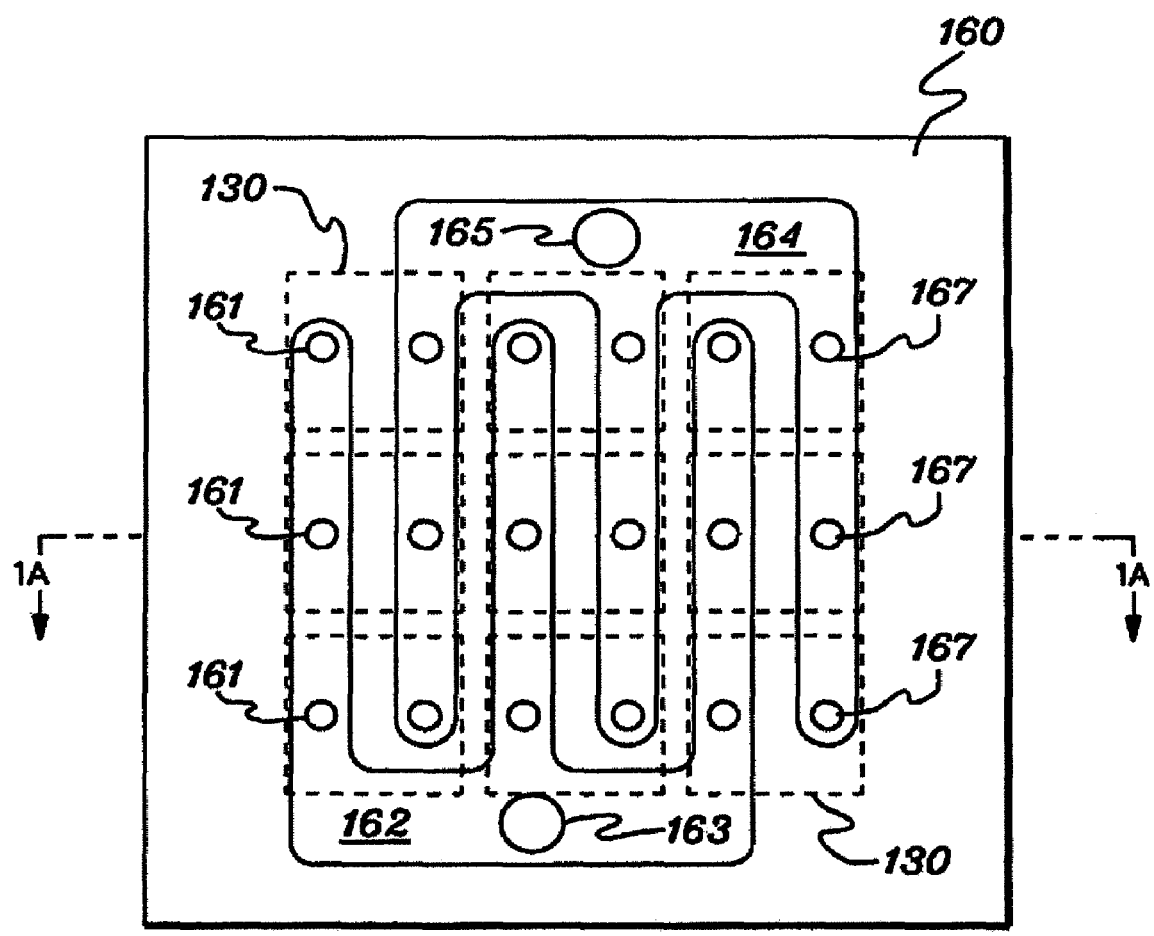
FIG. 1B is a cross-sectional plan view of the cooled electronics module of FIG. 1A taken along line 1B-1B, in accordance with an aspect of the present invention.

FIG. 1B is a cross-sectional plan view of the electronics module 100 of FIG. 1A taken along line 1B-1B through manifold 160 of the enclosure. In this embodiment, a single inlet plenum 162 and a single outlet plenum 164 are provided within manifold 160. A single coolant inlet 163 feeds coolant to inlet plenum 162, while a single coolant outlet 165 exhausts coolant from outlet plenum 164. Each plenum 162, 164 includes a plurality of fingers or coolant distribution passages which extend over each coolant-carrying cold plate 130. The fingers of each plenum expose a central flow passage of each tube, with a first set of tubes 161 shown in fluid communication with inlet plenum 162, and a second set of tubes 167 in fluid communication with outlet plenum 164. Note that in this embodiment, each exposed tube 161, 167 is shown to comprise an identically-sized coolant flow passage. In alternate embodiments, the coolant-carrying tubes could be differently sized (and/or shaped) to facilitate the delivery of different amounts of coolant to different cold plates with different coolant flow characteristics within the electronics module. A further variation of this concept is depicted in FIGS. 4A & 4B, and described below.

In the embodiment of FIGS. 1A & 1B, cap 150 can be fabricated of any suitably strong metal or plastic. Manifold 160 can either be metallurgically, mechanically or chemically attached to cap 150, depending on the choice of cap material, and the type of seal desired between the cap and the manifold. For example, if the cap were to be made of copper or aluminum, the manifold could be brazed to the cap employing a copper-to-copper braze or an aluminum-to-aluminum braze. Further, the cooling apparatus includes an enclosure, comprising cap 150 and manifold 160, which has a perimeter region that engages substrate 110 to form an at least partially enclosed cavity 157, with the multiple heat generating electronics components 120 and the multiple cold plates 130 disposed within cavity 157. Thus, the cooling apparatus and electronics assembly together define a cooled electronics module.

Figure 3:
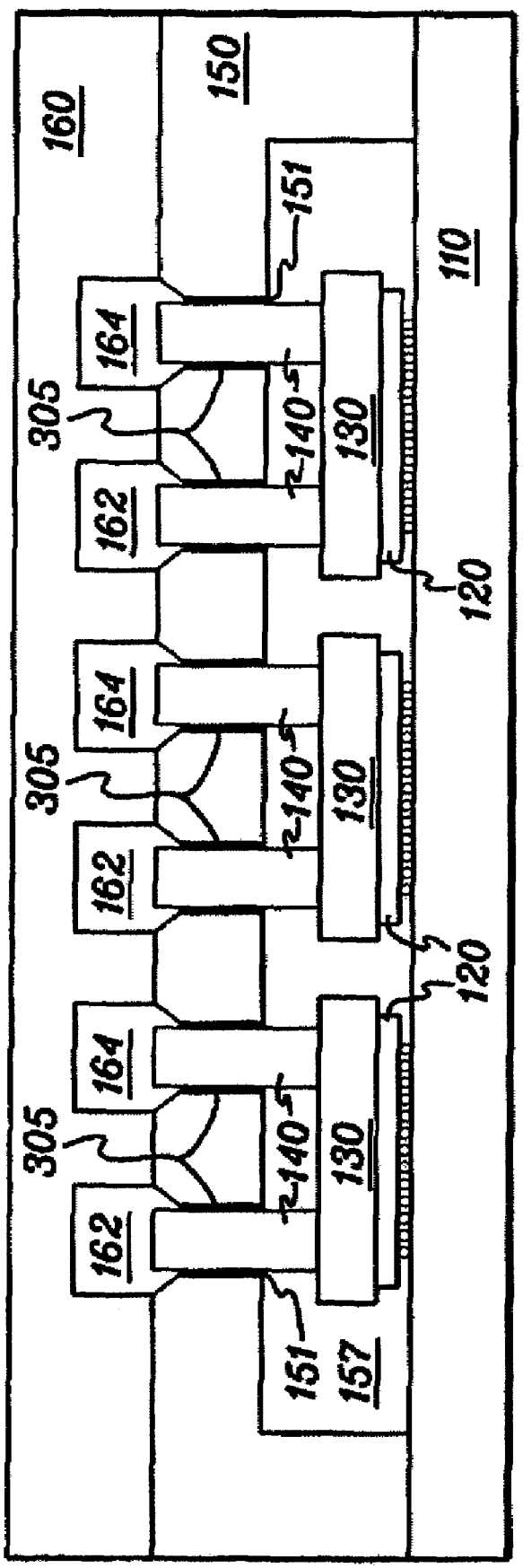
FIG. 3 is a cross-sectional elevational view of an another embodiment of a cooled electronics module with a cooling apparatus in accordance with an aspect of the present invention.

FIG. 3 depicts an alternative embodiment of a cooled electronics module 300 having the same or similar components to those described above in connection with the electronics module of FIGS. 1A & 1B. A substrate 110 again supports multiple heat generating electronics components 120, each of which has coupled thereto a cold plate 130. Extending from each discrete cold plate 130 are at least two tubes 140, each in fluid communication with one of the inlet plenum 162 and outlet plenum 164 configured in the enclosure comprising cap 150 and manifold 160. Again, cap 150 has a perimeter region for engaging substrate 110 to form an at least partially enclosed cavity 157 within which the multiple electronics components 120 and multiple cold plates 130 are disposed. In this embodiment, cap 150 is again configured with a plurality of bores 151, each of which is sized and located to at least partially receive a respective coolant-carrying tube 140 extending from aligned cold plate 130. In this alternate embodiment, each tube 140 is sealed to the inner wall of the associated bore 151 via a soldered annular seal 305 disposed between the outer surface of each tube and the inner wall of cap 150 defining bore 151. Beveling at an upper portion of each bore 151 facilitates positioning of solder 305 between each tube 140 and the respective inner wall of cap 150. In this embodiment, cap 150 might comprise copper, as would tubes 140. Further, as with the embodiment of FIGS. 1A & 1B, cold plates 130 may be attached to the respective electronics components 120 via an appropriate thermally conductive adhesive, or a metallurgical joint.

Figure 4A:
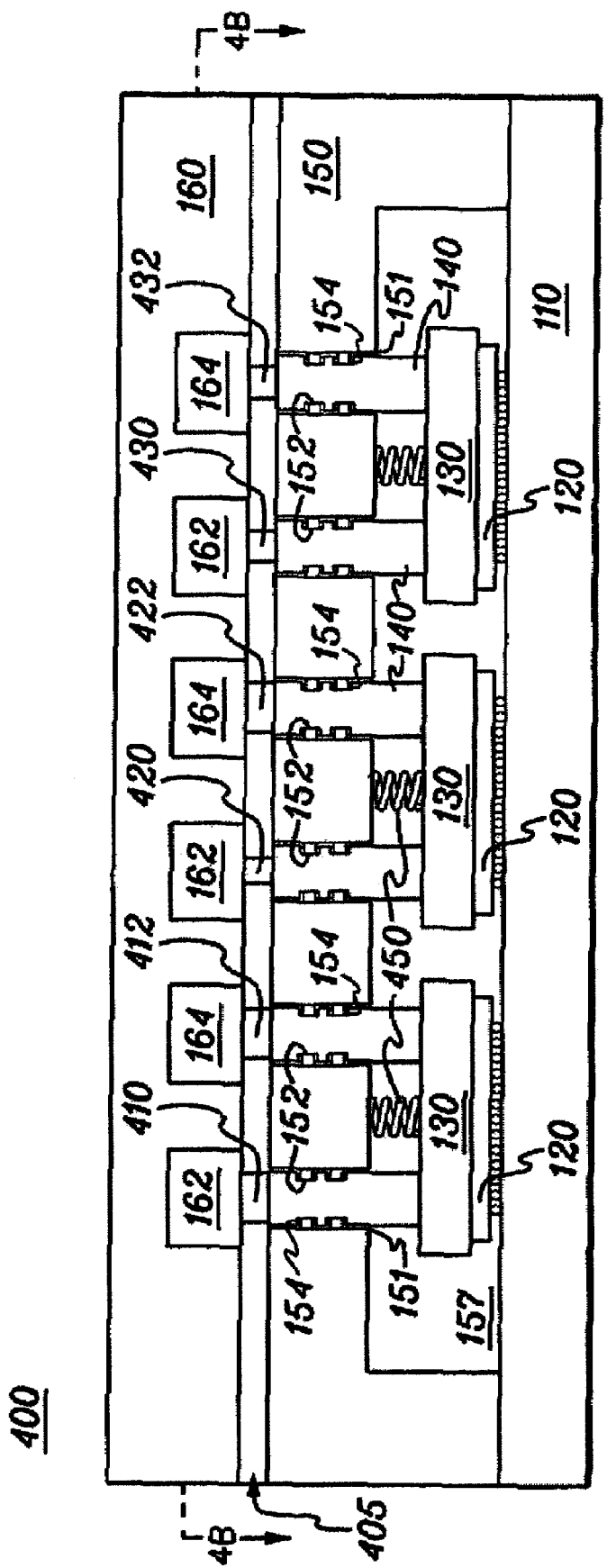
FIG. 4A is a cross-sectional elevational view of still another embodiment of a cooled electronics module (taken along line 4A-4A of FIG. 4B), with a cooling apparatus in accordance with an aspect of the present invention.
Figure 4B:
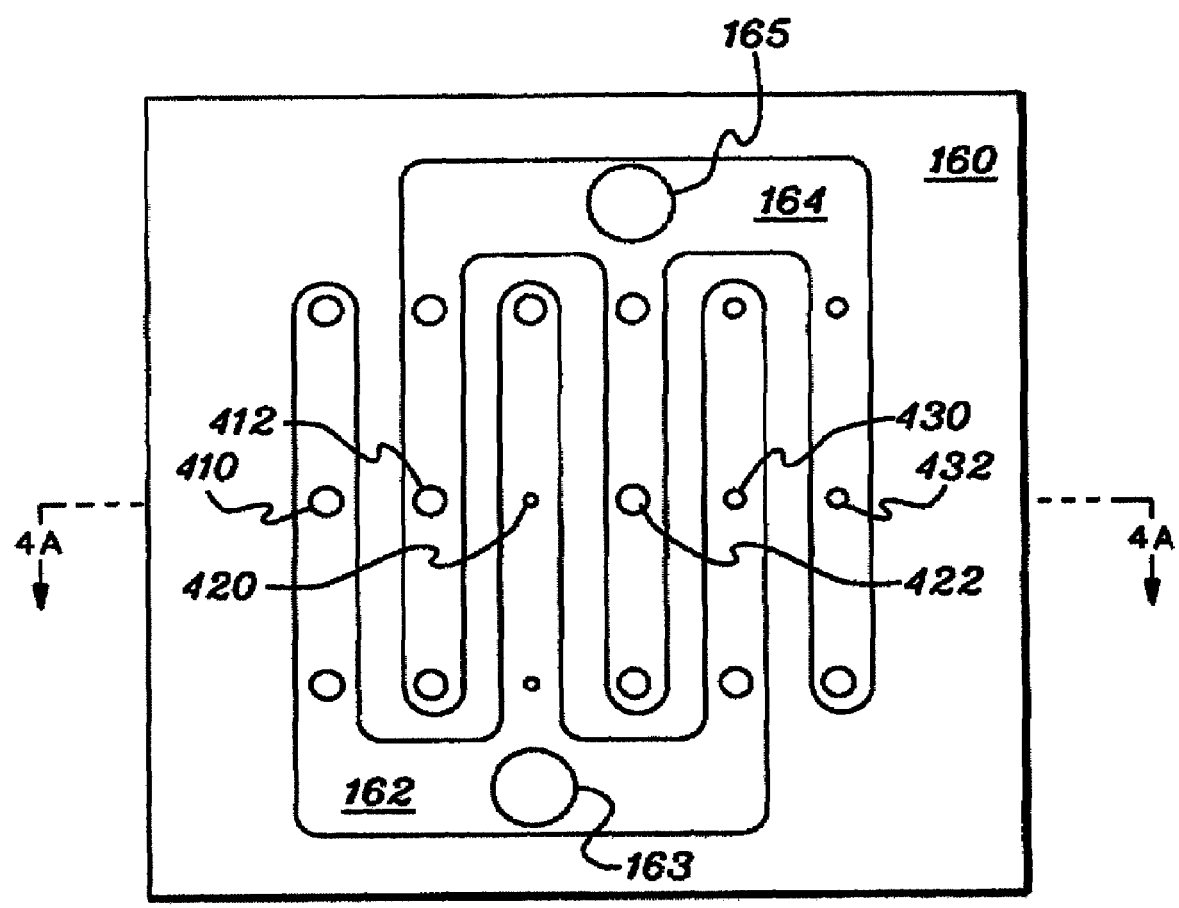
FIG. 4B is a cross-sectional plan view of the cooled electronics module of FIG. 4A taken along line 4B-4B, in accordance with an aspect of the present invention.

As referenced above, FIGS. 4A & 4B depict a further embodiment of an electronics module 400 in accordance with an aspect of the present invention. Similar to the above-referenced embodiments, module 400 includes a substrate 110, which supports multiple heat generating electronics components 120, each of which has coupled thereto a cold plate 130. Extending from each discrete cold plate 130 are at least two tubes 140, each in fluid communication with one of the inlet plenum 162 and outlet plenum 164 configured in the enclosure comprising cap 150 and manifold 160. Again, cap 150 has a perimeter region for engaging substrate 110 to form an at least partially enclosed cavity 157 within which the multiple electronics components 120 and multiple cold plates 130 are disposed. In this embodiment, cap 150 is configured with a plurality of bores 151, each of which is sized and located to at least partially receive a respective coolant-carrying tube 140 extending from an aligned cold plate 130. Each tube 140 is sealed to an inner wall of cap 150 defining the respective bore 151 by a sealant, which in this embodiment, comprises a double O-ring or equivalent elastomeric seal 152 disposed between the tube and the cap 150. To facilitate positioning of the O-rings, multiple circumferential grooves 154 are provided in the outer surface portion of each tube 140 disposed within the associated bore. Further, as with the embodiment of FIGS. 1A & 1B, cold plates 130 may be attached to the respective electronics components 120 via appropriate thermally conductive adhesive, or a metallurgical joint.

As shown in FIG. 4A, electronics module 400 further includes an orifice plate 405 disposed between cap 150 and manifold 160. This orifice plate is a customized flow plate that allows for the tailoring of coolant flow through the individual cold plates 130. As shown, plate 405 is configured with different sized openings which align with different coolant-carrying tubes 140, thereby tailoring the flow through the tubes either from inlet plenum 162 or to outlet plenum 164. In the embodiments of FIGS. 4A & 4B, an opening 410 is provided in orifice plate 405, which aligns between inlet plenum 162 and a first, leftmost coolant-carrying tube 140, while a second opening 412 is provided in orifice plate 405 to align between outlet plenum 164 and a second coolant-carrying tube 140. As shown in FIG. 4B, openings 410 & 412 are similarly sized. In the middle of the module, a smaller opening 420 is provided in orifice plate 405 between inlet plenum 162 and a tube 140 in communication with the inlet of the center cold plate 130, while a slightly larger opening 422 is aligned between outlet plenum 164 and tube 140 in fluid communication with the coolant outlet of this cold plate. By differently sizing the openings, the pressure drop and the flow rate of fluid through the cold plate can also be controlled, in addition to the amount of fluid in the cold plate. Orifice plate 405 further includes an opening 430 aligned between inlet plenum 162 and a corresponding tube 140 coupled in fluid communication with the coolant inlet for the rightmost cold plate 130, and an opening 432 aligned between outlet plenum 164 and a second tube 140 in fluid communication with the coolant outlet of the rightmost cold plate 130. Although of equal size, these openings are shown to be of smaller size than the openings 410 & 412 for the leftmost cold plate illustrated in FIG. 4A (see FIG. 4B). Advantageously, employing an orifice plate to tailor the coolant flow through the multiple cold plates allows for a single sized coolant carrying tube to be employed throughout the module, while still allowing for tailoring of the cooling achieved by each cold plate, which would be advantageous should the heat generating capacity of the electronics components differ when in operation.

Also shown in FIG. 4A are multiple springs 450, each disposed between a respective cold plate 130 and cap 150. If the interface between cold plates 130 and electronics components 120 is a compliant thermal interface (e.g., a paste, grease, oil or gel interface), a biasing mechanism, such as springs 450, may be used to provide a desired force against the cold plates to ensure a favorable thermal contact between each cold plate and its respective electronics component, as well as provide cold plate compliance which allows the electronics components to vary in height and/or orientation within the electronics assembly.

Various methods of fabrication of an electronics module and/or cooling apparatus such as described above can be employed. The particular fabrication or assembly approach depends upon, in one embodiment, the type of tube-to-cap seal to be employed. If O-ring seals similar to that depicted in FIGS. 1A & 1B or 4A & 4B are employed, and the O-rings can withstand the cold plate-to-electronics component interface reflow/curing temperature, then the tubes affixed to the cold plate are partially inserted into the cap, and the cap assembly is brought down onto the substrate to cause the cold plates to contact the electronics components. This intermediate assembly is then taken through the appropriate temperature cycle to make the cold plate-to-electronics component joint. Springs can be added between the cold plates and the cap to ensure good contact at the cold plate-electronics component interface. Alternatively, if the manifold is already in place above the cap, the manifold could be pressurized using air or an inert gas. Pressurizing the manifold region results in a net force on the cold plates that will cause the cold plates to be in compression with the electronics components, thus assuring a properly formed low thermal interface joint. If the O-ring seal cannot withstand the desired joining temperature, then a separate fixture can be used to position and join the cold plates to the electronics components without the O-rings present. The O-rings would then be added to the coolant-carrying tubes, and finally the cap or cap/manifold assembly would be placed onto the substrate.

If the solder seal version of FIG. 3 is to be employed, then assembly depends on the reflow temperature of the tube-to-cap joint/seal. If the reflow temperature of this seal is less than that for the cold plate-electronics component joint, then the cold plates would be joined to the electronics components first using the proper fixturing, and then the cold plate tubes would be joined to the cap in a second operation. Note that it is assumed in this discussion that the coolant-carrying tubes are affixed to or integral with the cold plates. If the tube-cap joint reflow temperature is higher than that of the cold plate-electronics component joint, then the cap-cold plate-module subassembly can be reflowed in one step.

Electronics module disassembly for component rework is also possible. For an O-ring seal version such as depicted in FIGS. 1A & 1B or 4A & 4B, the cap and manifold subassembly can be removed, leaving the cold plates on the electronics components, with the cold plates then being removed from the electronics components prior to component rework. For the soldered seal version of FIG. 3, if the tube-cap joint reflow temperature is less than the joining temperature at the cold plate-electronics component interface, then a reflow and cap/manifold removal can be performed first, followed by the cold plate removal employing the different reflow temperatures. If the tube-cap joint reflow temperature is higher than that of the cold plate-electronics component interface, then only one reflow step is required to remove the cooling apparatus from the electronics assembly.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of fabricating a cooling apparatus for facilitating cooling of an electronics assembly comprising a substrate supporting multiple heat generating electronics components to be cooled, the method comprising:

providing multiple discrete cold plates with a plurality of coolant-carrying tubes extending therefrom, each cold plate having a first surface configured to couple to a respective electronics component of the multiple electronics components, and each cold plate being a coolant-cooled cold plate configured with a coolant inlet and a coolant outlet with at least one coolant chamber disposed between the coolant inlet and the coolant outlet, each cold plate further having at least two coolant-carrying tubes of the plurality of coolant-carrying tubes extending from a second surface thereof, each coolant-carrying tube being in fluid communication with one of the coolant inlet and the coolant outlet of the cold plate from which the coolant-carrying tube extends;

coupling each cold plate to a respective electronics component of the multiple electronics components;

providing an enclosure having a perimeter region, and engaging the perimeter region of the enclosure with the substrate to form an at least partially enclosed cavity with the multiple heat generating electronics components and the multiple cold plates being disposed within the cavity defined by the substrate and the enclosure, wherein the enclosure is configured with a plurality of bores, each bore being sized and located to at least partially receive a respective coolant-carrying tube of the plurality of coolant-carrying tubes extending from the cold plates as the enclosure engages the substrate, the enclosure further being configured with a manifold in fluid communication with the plurality of bores and the plurality of coolant-carrying tubes disposed therein for distributing coolant in parallel to at least some cold plates of the multiple cold plates via a first set of coolant-carrying tubes of the plurality of coolant-carry tubes in fluid communication with the coolant inlets of the multiple cold plates, and for receiving coolant from at least some cold plates of the multiple cold plates via a second set of coolant-carrying tubes of the plurality of coolant-carry tubes in fluid communication with the coolant outlets of the multiple cold plates; and wherein the manifold further comprises a coolant inlet plenum and a coolant outlet plenum, the first set of coolant-carrying tubes being in fluid communication with the coolant inlet plenum and coupling in parallel the coolant inlets of the cold plates to the coolant inlet plenum, and the second set of coolant-carrying tubes being in fluid communication with the coolant outlet plenum and coupling in parallel the coolant outlets of the cold plates to the coolant outlet plenum, and the coolant inlet plenum and the coolant outlet plenum each comprising a plurality of coolant distribution fingers which extend over the at least some cold plates of the multiple cold plates for facilitating distribution of coolant in parallel to the at least some cold plates.

2. The method of claim 1, wherein the coupling comprises employing an interface material disposed between the first surface of each cold plate and its respective electronics component, the interface material comprising at least one of an adhesive or a metallurgical bond.

3. The method of claim 1, further comprising sealing each coolant-carrying tube to an inner wall of the enclosure defining the associated bore at least partially receiving the coolant-carrying tube, wherein the sealant comprises at least one of solder or at least one O-ring seal.

* * * * *